(12) United States Patent
Ma et al.

(10) Patent No.: US 8,180,304 B2
(45) Date of Patent: May 15, 2012

(54) EFFICIENT POWER AMPLIFIER

(75) Inventors: Ssu-Pin Ma, San Jose, CA (US); Thai Nguyen, San Jose, CA (US); Feipeng Wang, San Jose, CA (US)

(73) Assignee: Quantenna Communications, Inc., Sunnyvale, CA (US)

( * ) Notice: Subject to any disclaimer, the term of this patent is extended or adjusted under 35 U.S.C. 154(b) by 987 days.

(21) Appl. No.: 12/061,491

(22) Filed: Apr. 2, 2008

(65) Prior Publication Data

US 2009/0253389 A1    Oct. 8, 2009

(51) Int. Cl.
*H04B 1/04*    (2006.01)

(52) U.S. Cl. ............... 455/114.3; 455/118; 455/313; 455/323; 455/341

(58) Field of Classification Search ............... 455/114.3, 455/118, 313, 319, 320, 323, 326, 341, 121, 455/124, 126; 330/136, 114 R, 129, 149, 330/256, 286; 375/296, 297
See application file for complete search history.

(56) References Cited

U.S. PATENT DOCUMENTS

| | | | |
|---|---|---|---|
| 6,639,464 B2 * | 10/2003 | Hellberg | 330/124 R |
| 6,774,717 B2 * | 8/2004 | Hellberg | 330/124 R |
| 7,221,219 B2 * | 5/2007 | Hellberg et al. | 330/124 R |
| 7,557,652 B2 * | 7/2009 | Klingberg et al. | 330/124 R |

* cited by examiner

*Primary Examiner* — Pablo Tran

(57) ABSTRACT

A technique for efficient power amplification includes providing multiple baseband signals to an amplifier. The signals may be converted to RF and combined through one or more impedance inverters.

3 Claims, 12 Drawing Sheets

600

EFFICIENT POWER AMPLIFIER

BACKGROUND

Improving the efficiency of a transmitter is an important task. Improving the efficiency of a power amplifier associated with the transmitter becomes the first priority of many studies. Much recent research effort has demonstrated the feasibility of integrating most transceiver building blocks into a single die. One of the few remaining blocks is the power amplifier.

Power amplifiers are typically categorized as class-A, class-AB, class-B, class-C, etc., depending upon the bias point. The bias point will affect the efficiency and linearity of a power amplifier. However, within the same class, the efficiency of a power amplifier will mainly be limited by supply voltage, load impedance, and output power.

For example, an ideal resistor load class-A power amplifier may be biased with some DC current. Maximum output voltage will not exceed the supply voltage. Load impedance and supply voltage will define maximum output power. For best efficiency at maximum output, the circuit can be biased and DC output voltage made half of the supply voltage. The load impedance can be chosen to make the maximum output swing exactly the voltage difference between the supply voltage and reference ground.

At small signal, constant biased DC current with small output signal yields low efficiency. Maximum efficiency occurs at maximum output swing; the theoretical maximum efficiency of an ideal resistor load class-A amplifier is 25%. For a larger maximum output signal, the amplifier needs lower load impedance. However, compared to a typical power amplifier at small signal, the amplifier will have lower efficiency because the DC current will be higher.

Similar trade-offs happen with other types of power amplifiers. The load impedance will define the maximum output power and small signal efficiency. Since modern digital communications often have large and small signal components in a signal structure, there are ongoing efforts to develop technologies that improve small signal efficiency without significantly degrading large signal efficiency.

Doherty power amplifiers can be used to try to decouple the output loading impedance, which defines maximum output power, and load impedance at small signal. A normal Doherty power amplifier has a main power amplifier, an auxiliary power amplifier, an impedance inverter at output for signal combining, and a phase shifter before the auxiliary power amplifier to adjust the auxiliary signal phase for proper signal combination.

A normal Doherty power amplifier needs to control the analog gain of 2 paths to achieve the best combining. To overcome device variation, most of these Doherty amplifiers have some mechanisms to control analog gain and block phase. Those controls must be applied at Radio Frequency (RF) blocks. It is difficult to freely decouple the control of gain and phase using known techniques.

The foregoing examples of the related art and limitations related therewith are intended to be illustrative and not exclusive. Other limitations of the related art will become apparent to those of skill in the art upon a reading of the specification and a study of the drawings.

SUMMARY

The following embodiments and aspects thereof are described and illustrated in conjunction with systems, tools, and methods that are meant to be exemplary and illustrative, not limiting in scope. In various embodiments, one or more of the above-described problems have been reduced or eliminated, while other embodiments are directed to other improvements.

We make the most of the control at baseband signal to control the electrical properties of Radio Frequency (RF) blocks. We suggest an amplifier with more than one Base Band signal input. The signals will be converted to RF and combined through one or more impedance inverters. Because the phase and amplitude of a RF signal can be controlled by its Base Band signal, we can achieve our goal to move most control from circuit blocks to the signal itself.

The description in this paper describes this technique and examples of systems implementing this technique.

BRIEF DESCRIPTION OF THE DRAWINGS

Examples of the claimed subject matter are illustrated in the figures.

DETAILED DESCRIPTION

In the following description, several specific details are presented to provide a thorough understanding of examples of the claimed subject matter. One skilled in the relevant art will recognize, however, that one or more of the specific details can be eliminated or combined with other components, etc. In other instances, well-known implementations or operations are not shown or described in detail to avoid obscuring aspects of the claimed subject matter.

Figure 1:
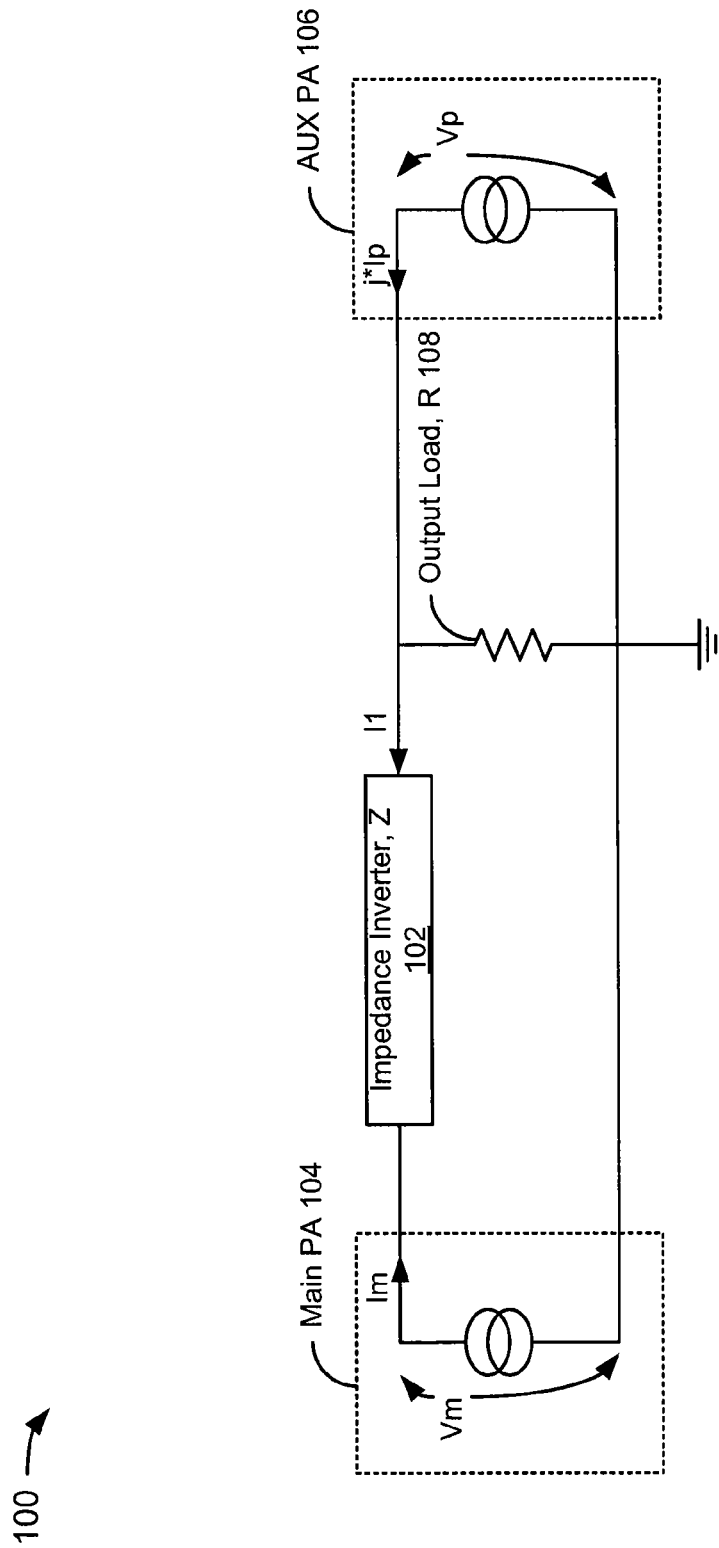
FIG. 1 depicts an example of an ideal efficient amplifier system.

FIG. 1 depicts an example of an ideal efficient amplifier system 100. The system 100 includes an impedance inverter 102, a main power amplifier (PA) 104, an auxiliary (AUX) PA 106. An output load 108 is also depicted. For illustrative purposes, the main PA 104 and the AUX PA 106 are depicted as including a general signal source. The impedance inverter 102 can transfer the impedance look out from the main PA 104. Where Z is the characteristic impedance of the impedance inverter 102, $V_m$ is the voltage across the Main PA 104, $I_m$ is the current out of the Main PA 104, $V_p$ is the voltage across the AUX PA 106, $j*I_p$ is the current out of the AUX PA 106, where j means there is, for example, a 90 degree difference between $I_m$ and $I_p$, the impedance matrix of, e.g., a 90 degree impedance inverter (by way of example, but not limitation a quarter-wave-length transmission line) can be represented as:

$$\begin{bmatrix} V_p \\ I_1 \end{bmatrix} = \begin{bmatrix} 0 & jZ \\ 1/jZ & 0 \end{bmatrix} \begin{bmatrix} V_m \\ I_m \end{bmatrix}$$

Where a signal from the AUX PA 106 is 90 degrees phase shifted from the main PA 104, and where the output loading impedance (of the output load 108) is R, the output voltage at the main PA 104 can be represented as:

$$V_m = Z\left[\left(\frac{Z}{R}\right)I_m - I_p\right]$$

And we know the impedance look out from the main PA 104 can be represented as:

$$Z_m = \frac{V_m}{I_m}$$

To make good use of the system 100, the main PA 104 can be driven without signal from the AUX PA 106 when the signal is small. The impedance look out from the main PA 104 will be $Z^2/R$. If Z is chosen to be larger than the output loading impedance R, the main PA 104 will operate at a steeper load line. The efficiency of the main PA 104 is better than, for example, when simply connecting the main PA 104 to the output load 108. Once the main PA 104 reaches maximum swing, which is normally defined by the supply voltage, the AUX PA 106 can be activated. When this happens, the AUX PA 106 current, $j*I_p$, can reduce the impedance look out from the main PA 104. With proper control of the AUX PA 106, ideally the main PA 104 can be kept at maximum swing and enjoy a better efficiency. Advantageously, utilizing these techniques, the main PA 104 can operate relatively close to maximum swing and be efficient.

Figure 2:
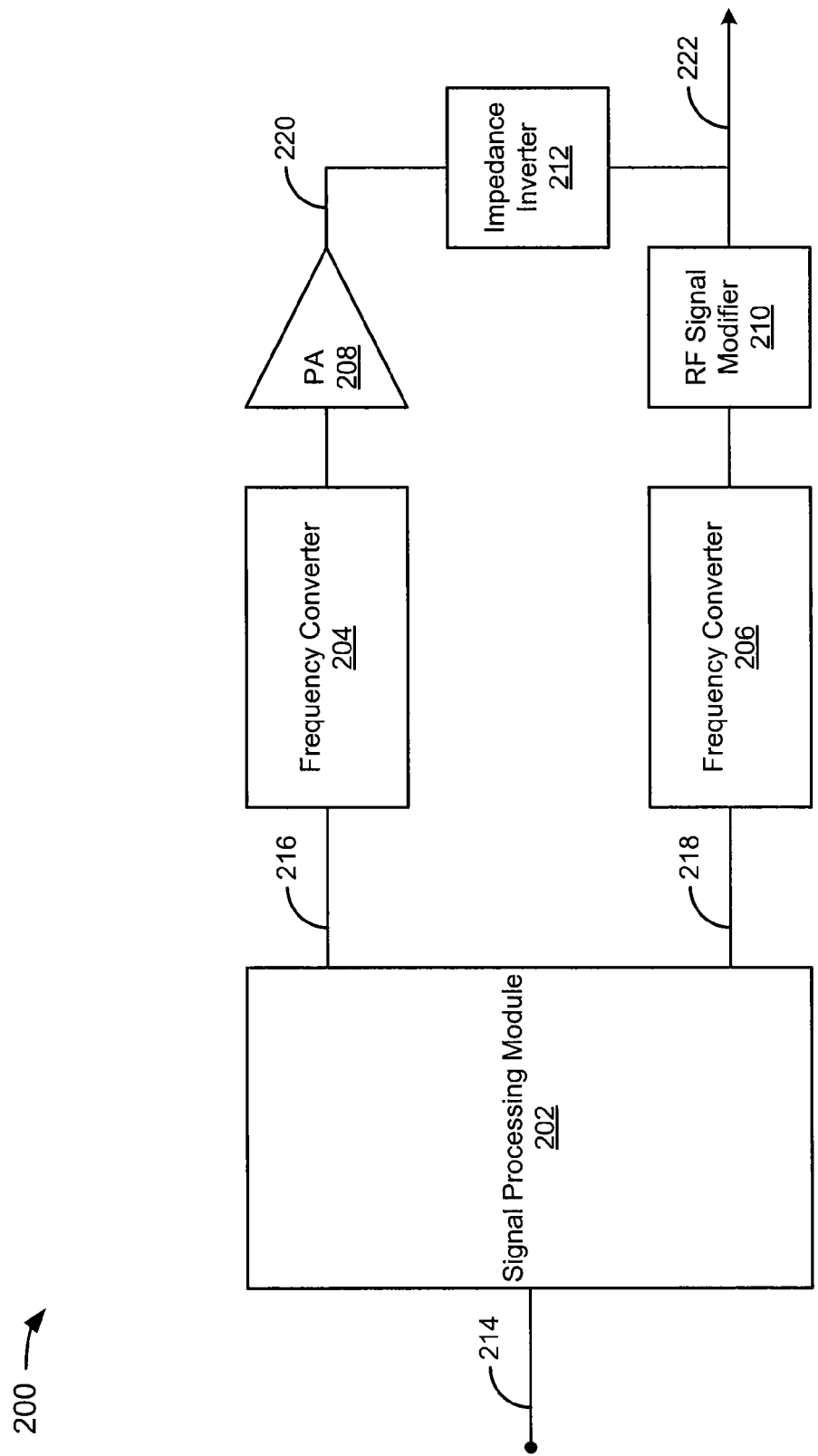
FIG. 2 depicts an example of an amplifier.

FIG. 2 depicts an example of an amplifier system 200. The amplifier system 200 includes a signal processor module 202, a frequency converter 204, a frequency converter 206, a power amplifier (PA) 208, an RF signal modifier 210, and an impedance inverter 212. Because some of the control functionality of the amplifier system 200 is pushed back to the signal processor module 202, the output stages can have reduced complexity. One advantage of the amplifier system 200 is that the amplifier component is efficient, and should enable implementation on a single CMOS die along with other transceiver components.

In the example of FIG. 2, the signal processor module 202 may be implemented as one or more digital or analog baseband (BB) signal processors. In operation, the signal processor module 202 produces BB signals 216 and 218 from an original BB signal 214. In some implementations, the original BB signal 214 is modified to produce the BB signals 216 and 218, and in other implementations, the original BB signal 214 is the same, or approximately the same, as the BB signal 216 or the BB signal 218.

The signal processing module 202 may include a digital pre-distorter, which can further improve efficiency of the system 200. Digital pre-distortion can improve efficiency. As PA is driven close to saturation, efficiency improves. If pre-distort, the PA itself operates in saturation region, but the signal itself looks linear.

Figure 3A:
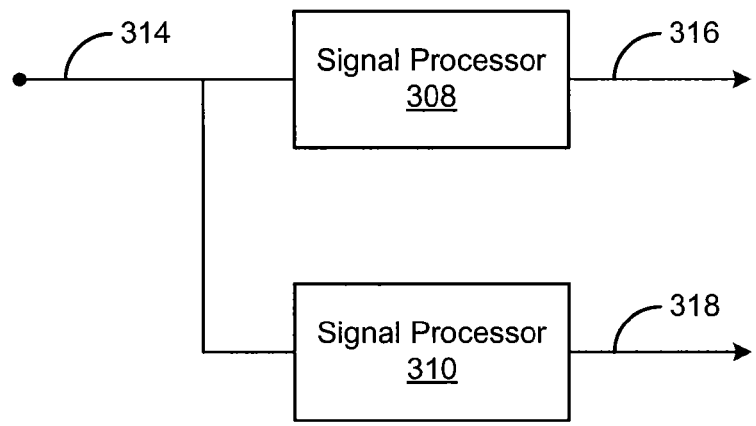
FIGS. 3A and 3B depict examples of baseband signal processing modules suitable for use with the amplifier of FIG. 2.

FIG. 3A depicts an example of a signal processor module 300A that includes signal processors for producing BB signals that are different than an original BB signal. The signal processor module 300A includes a signal processor 308 and a signal processor 310. In operation, an original BB signal 314 is processed at the signal processor 308 to produce a first BB signal 316 and the original BB signal 314 is processed at the signal processor 310 to produce a second BB signal 318.

Figure 3B:
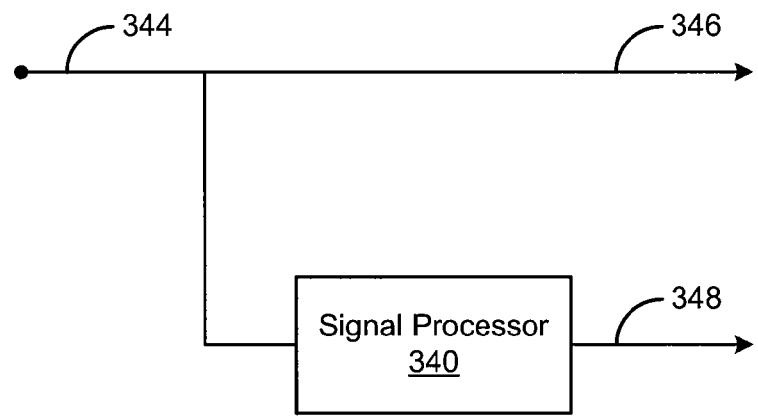

FIG. 3B depicts an example of a signal processor module 300B that includes a signal processor for producing a BB signal that is different from the original BB signal. The signal processor module 300B includes a signal processor 340. In operation, an original BB signal 344 is provided as a first BB signal 346. (As should be clear from the example of FIG. 3B, the original BB signal 344 and the first BB signal 346 are essentially the same signal.) The original BB signal 344 is processed at the signal processor 340 to produce a second BB signal 348.

Referring once again to the example of FIG. 2, one of the advantages of the signal processor module 202 is that an original BB signal 214 can be split into a main BB signal (the first BB signal 216) and an auxiliary BB signal (the second BB signal 218). This moves control out of radio frequency (RF) blocks, where such control is difficult, into the BB where control, such as by way of example but not limitation changing phase, is easy. This may reduce complexity at output stages, as should be apparent from the operation of the amplifier 200. In addition, it may be possible to improve performance by changing BB signal gain (or loss).

Figure 4:
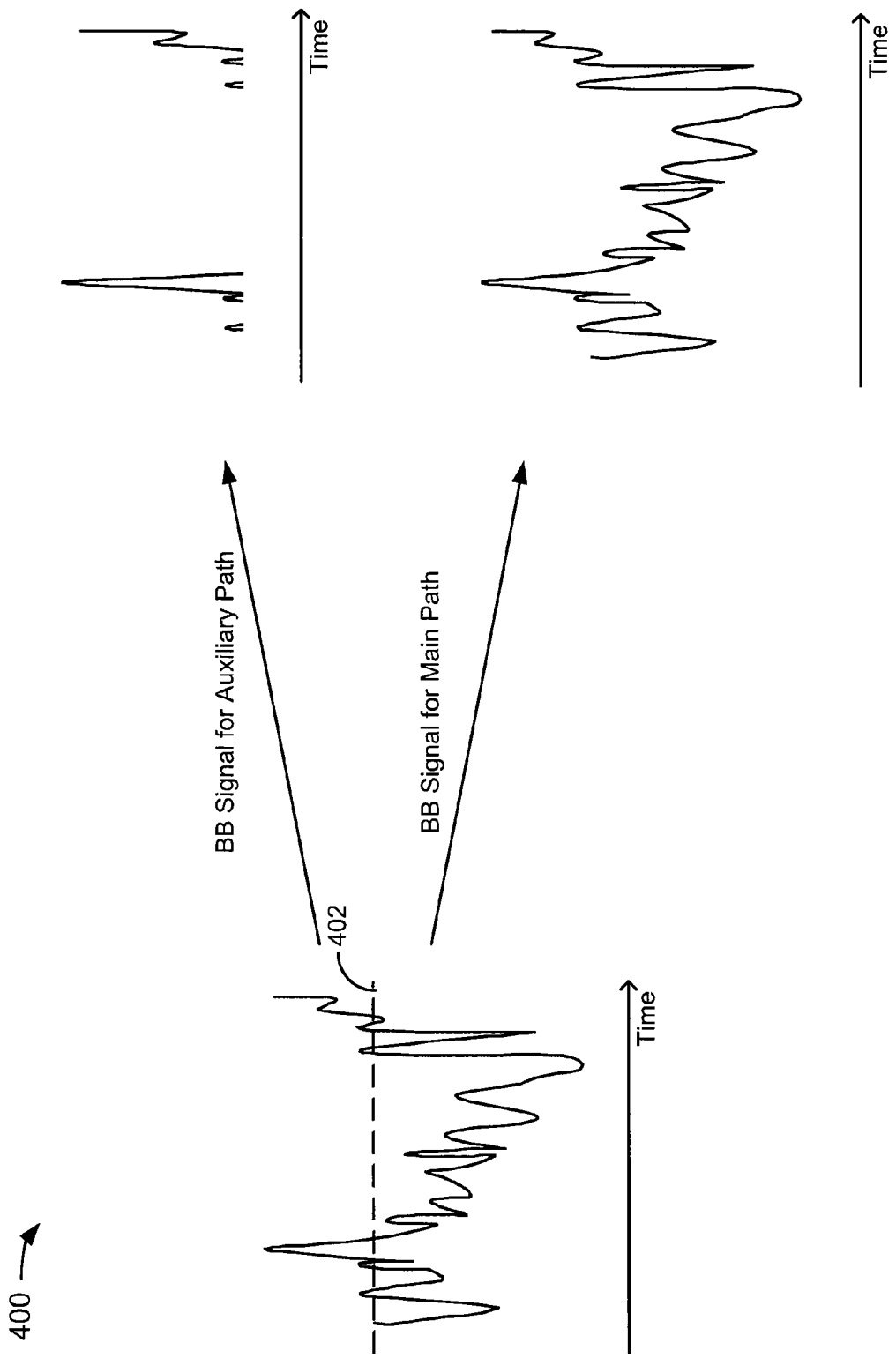
FIG. 4 illustrates the concept of an auxiliary amplitude threshold.

The BB signal can, for example, be chopped to control its conducting angle. It is possible to process the original BB signal by generating an auxiliary BB signal only when an output signal exceeds a particular value. FIG. 4 illustrates this principle by way of example but not limitation. As illustrated, anything below an auxiliary amplitude threshold 402, or clip point, is "cut off" such that the auxiliary BB signal only includes the portion of the signal that is above the threshold. The main BB signal, in this example, is the same as the original BB signal.

Referring once again to the example of FIG. 2, the frequency converter 204 up-converts to RF the first BB signal 216 from the signal processing module 202. The frequency converter 206 up-converts to RF the second BB signal 218 from the signal processing module 202. The phase and amplitude of the RF signals can be changed by changing the phase and amplitude of the input BB signals. If the conversion is linear at a carrier frequency, the equation, $f(A \cdot S_{BB}(\phi)) = A \cdot k \cdot S(\phi + \omega_{RF} \cdot t)$ explains the relationship. In this paper, linear frequency conversion is described because the explanation is easier to describe. However, those of skill in the relevant art with this paper before them would find nonlinear frequency conversion relatively easy to implement.

The frequency converters 204, 206 are at least similar in functionality and are expected in implementation to be topologically similar as well, though this is not required. The frequency converters may include one or more mixers and may have additional inputs not shown in FIG. 2; there are many ways to build a frequency converter.

Figure 5:
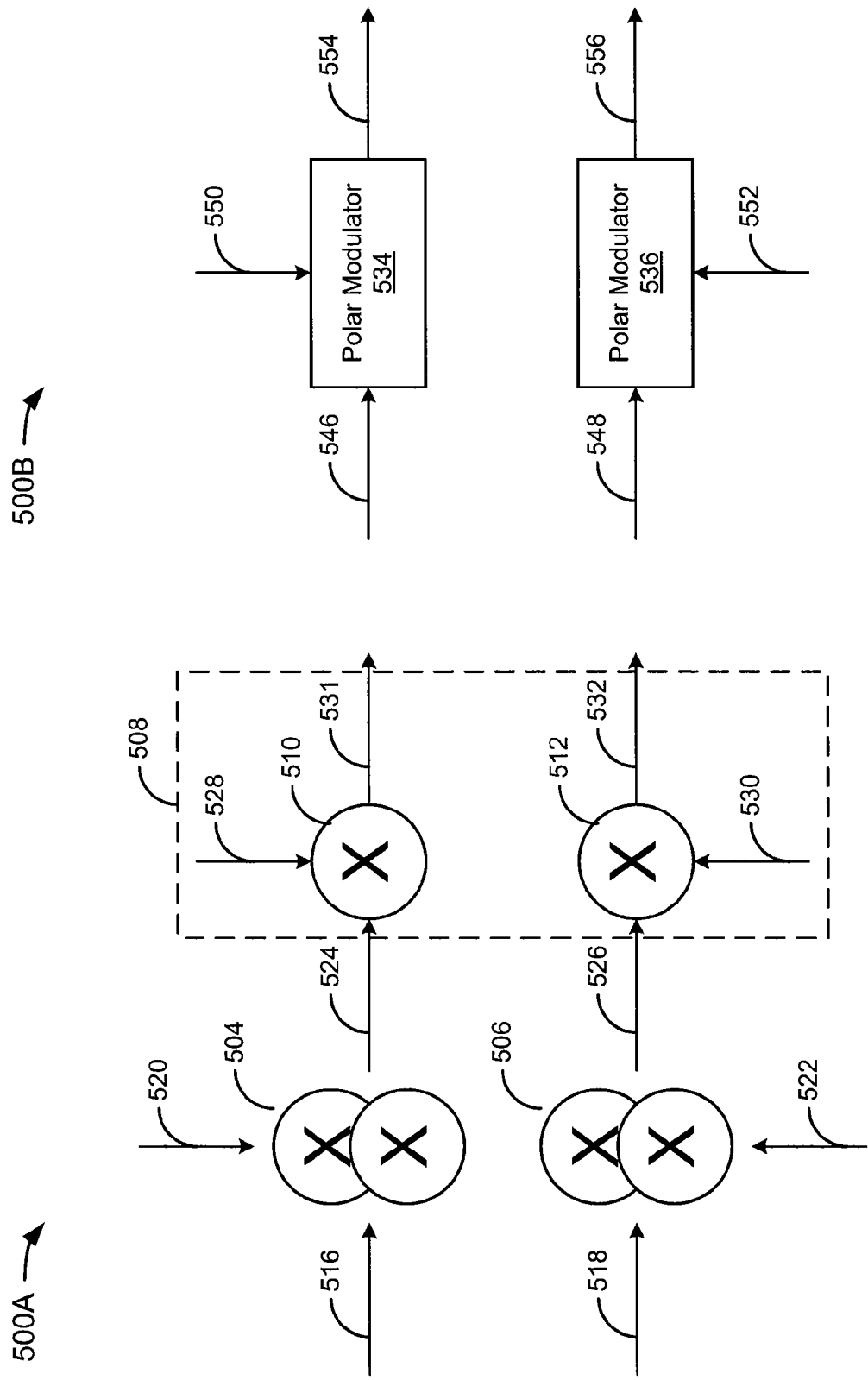
FIGS. 5A and 5B depict examples of frequency converters suitable for use with the amplifier of FIG. 2.

FIG. 5A depicts an example of a frequency converter 500A that includes mixers. The frequency converter 500A includes a mixer 504, a mixer 506, and an optional mixer module 508. The optional mixer module 508 includes a mixer 510 and a mixer 512. In operation, the mixer 504 receives a first BB signal 516 and the mixer 506 receives a second BB signal 518. The first BB signal 516 may be by way of example but not limitation a main BB IQ signal, and the second BB signal 518 may be by way of example but not limitation an auxiliary BB IQ signal. The mixer 504 also receives a control signal 520 and the mixer 506 receives a control signal 522. The control signals may be by way of example but not limitation IQ LO signals. If the frequency converter 500A does not include the optional mixer module 508, then the output 524 of the mixer 504 and the output 526 of the mixer 506 may be RF signals that are output from the frequency converter 500A.

If the frequency converter 500A includes the optional mixer module 508, then the mixer 510 receives the output 524 of the mixer 504 and the mixer 512 receives the output 526 of the mixer 506, along with control signals 528 and 530 respectively. The control signals 528, 530 may be IQ LO signals. The output 524 and the output 526, in this example, could conceivably be referred to as IF signals. The outputs 531, 532 of the mixers 510, 512, would typically be RF outputs of the frequency converter 500A.

FIG. 5B depicts an example of a frequency converter 500B that includes polar modulators. The frequency converter 500B includes a polar modulator 534 and a polar modulator 536. The polar modulators may be by way of example but not limitation phase and amplitude modulators. In this case, the input signals to the polar modulators may be amplitude and phase signals. For example, the polar modulator 534 may receive a main BB amplitude signal 546 and a main BB phase signal 550 and the polar modulator 536 may receive an auxiliary BB amplitude signal 548 and an auxiliary BB phase signal 552. The output 554, 556 of the frequency converter 500B may be RF.

Referring once again to the example of FIG. 2, one of the advantages of the frequency converters 204, 206 is that they need not be followed with gain fine tune or tunable phase shift, as might be required in the RF domain when making use of, for example, a Doherty power amplifier. Changing phase in the RF domain is difficult, but changing phase in the BB is not. Gain fine tune and tunable phase shift are unnecessary in the RF domain of the amplifier 200 because the signal is controlled in the BB, instead of the RF, domain.

In the example of FIG. 2, the PA 208 receives the RF signal from the frequency converter 204. The functionality of the PA 208 could conceivably be moved into the frequency converter 204. The PA 208 may be selected from practically any class (e.g., A, B, AB, C, D, E, F, and other applicable known or convenient amplifier circuit structures). One of the reasons such a wide selection of amplifier circuits is available is because the conducting angle and gain can be selected at BB.

The RF signal modifier 210 receives the RF signal from the frequency converter 206. The functionality of the RF signal modifier 210 could conceivably be moved into the frequency converter 206 if, for example, the frequency converter 206 has current generating capabilities. The RF signal modifier 210 can be implemented as an RF power generator or an RF current generator. The RF signal modifier 210 can also be implemented as a PA. Like the PA 208, the RF signal modifier 210, when implemented as a PA, would not necessarily be limited to a particular class because the RF signal modifier 210 can benefit from the selection of the conducting angle and gain at BB. Thus, in an implementation in which the RF signal modifier 210 includes a PA, the PA can be selected from practically any class (e.g., A, B, AB, C, D, E, F, and other applicable known or convenient amplifier circuit structures). There is not necessarily a restriction to, for example, a class C amplifier.

In the example of FIG. 2, the output 220 of the PA 208 and the output 222 of the RF signal modifier 210 are coupled to the impedance inverter 212. (The output 222 is also Vout.)

Figure 6:
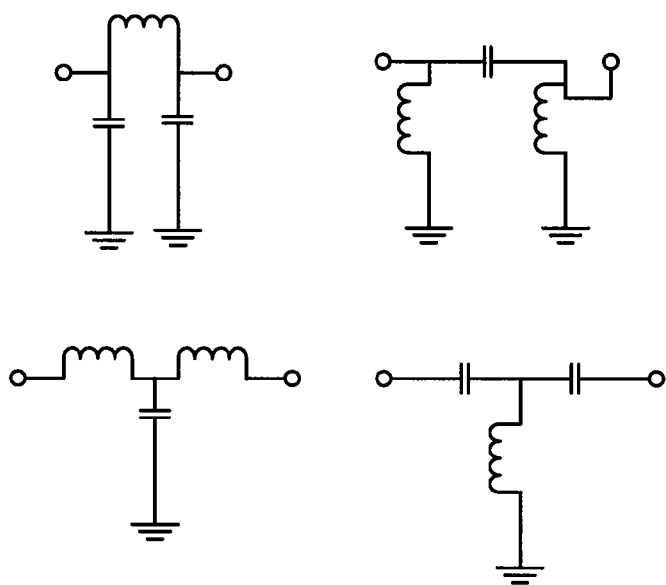
FIG. 6 depicts examples of prior art lump-type phase shifters.

The impedance inverter 212 may include, by way of example but not limitation, a quarter-wave-length transmission line, a 90° phase shifter, an impedance converter, other applicable known or convenient elements, or a combination thereof (e.g., a 90° phase shifter/impedance converter). The impedance inverter 212 can also include a lump-type phase shifter, examples of which are depicted in FIG. 6.

Referring once again to FIG. 2, in order to optimize efficiency, it is desirable to control signal phase to optimally combine at the output. If the impedance inverter 212 has a small phase difference from an ideal value, which comes from the frequency response or the device variation form process, it may be desirable to control the BB signal phase in the auxiliary path. Alternatively, the impedance inverter 212 could be adjusted to tune or trim the impedance inverter 212, though this may result in increased complexity, which may or may not increase loss and/or reduce efficiency.

Figure 7:
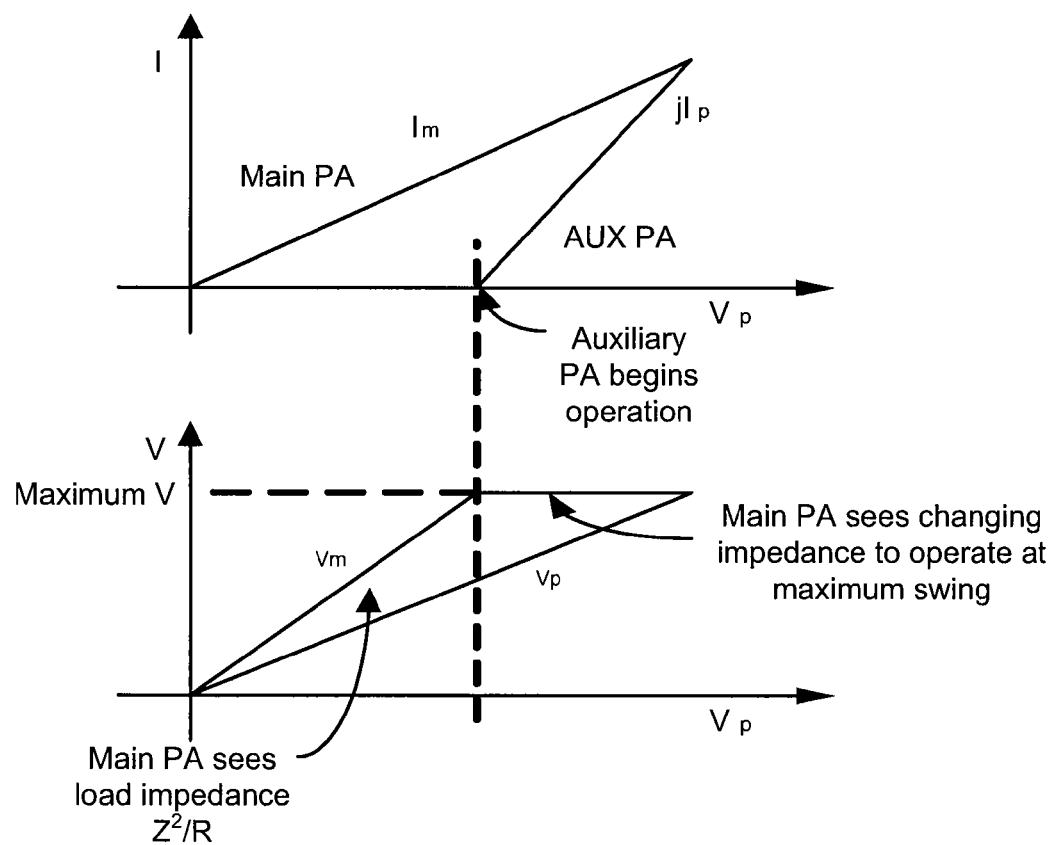
FIG. 7 depicts a graph illustrating how a PA sees a changing impedance to maintain operation at maximum swing.

Another difficult control is to control the conducting angle and the gain of the auxiliary path. It may be desirable for the RF signal modifier 210 to begin working at a particular amplitude of output swing. FIG. 7 depicts a graph illustrating how the PA 208 sees a changing impedance to maintain operation at maximum swing.

Figure 8:
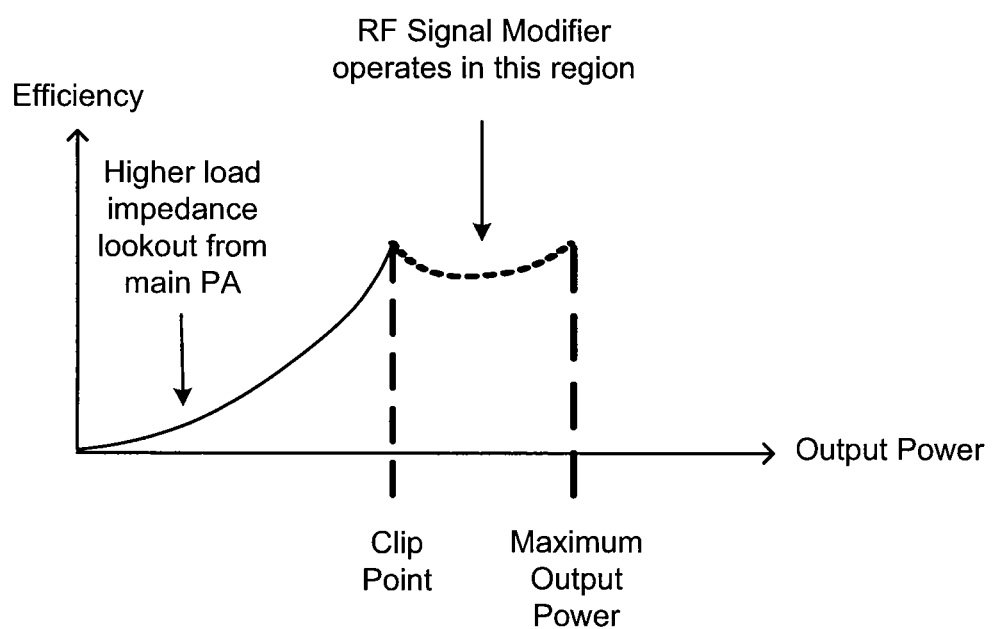
FIG. 8 depicts a graph illustrating an RF signal modifier operation region.

FIG. 8 depicts a graph illustrating an example of an auxiliary PA operation region. It may be desirable to determine a clip point with optional efficiency characteristics. After the clip point, the RF signal modifier 210 may begin to operate, and continue to operate to maximum output power.

Figure 9:
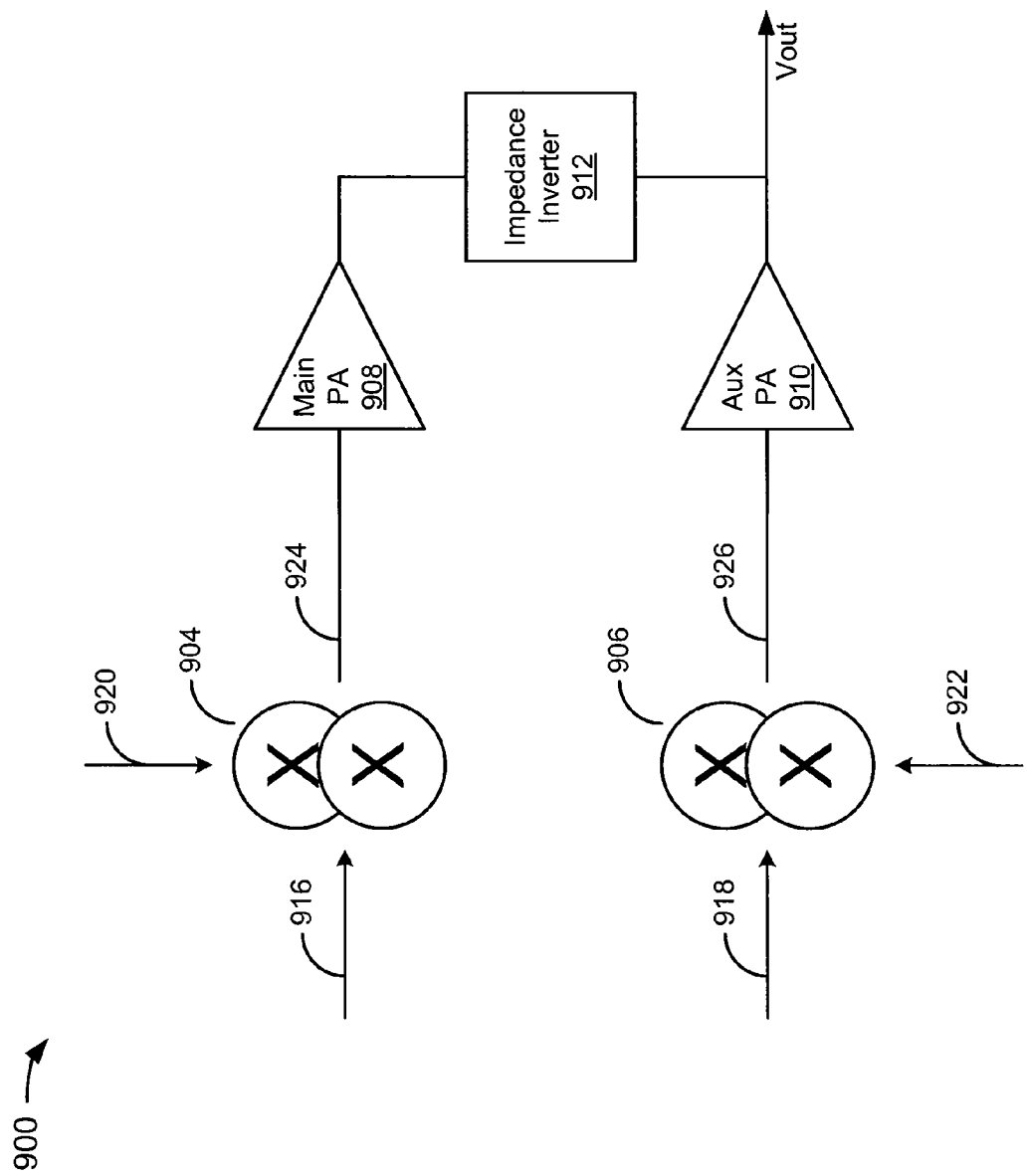
FIG. 9 depicts an example of a particular implementation of an efficient amplifier.

FIG. 9 depicts an example of a particular implementation 900 of an efficient amplifier. The implementation 900 includes components described previously in association with FIG. 2.

Figure 10:
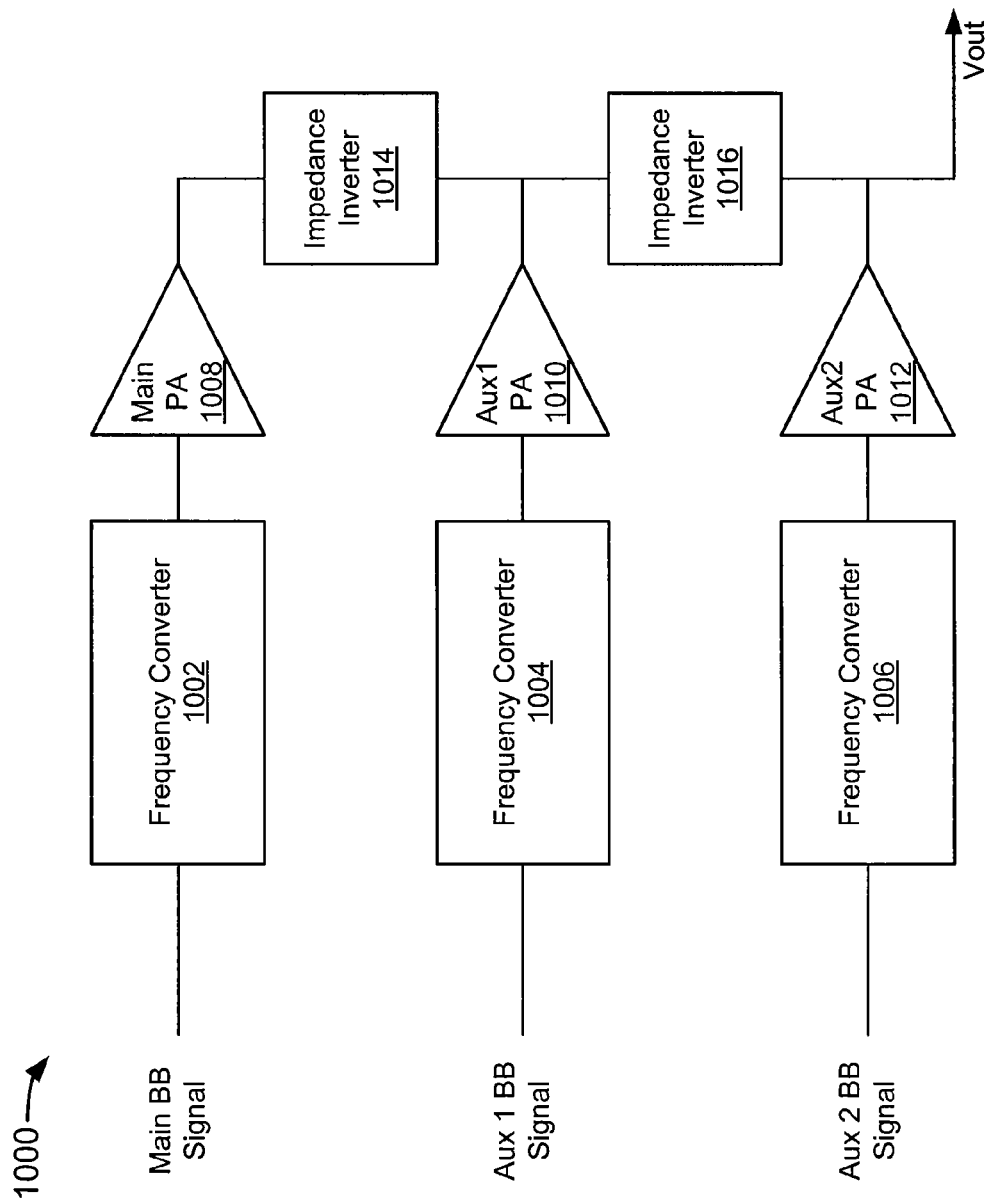
FIG. 10 depicts an example of an amplifier with multiple impedance inverters.

FIG. 10 depicts an example of an amplifier 1000 with multiple impedance inverters. Operation of the amplifier 1000 should be apparent from the description provided in association with FIG. 2.

Figure 11:
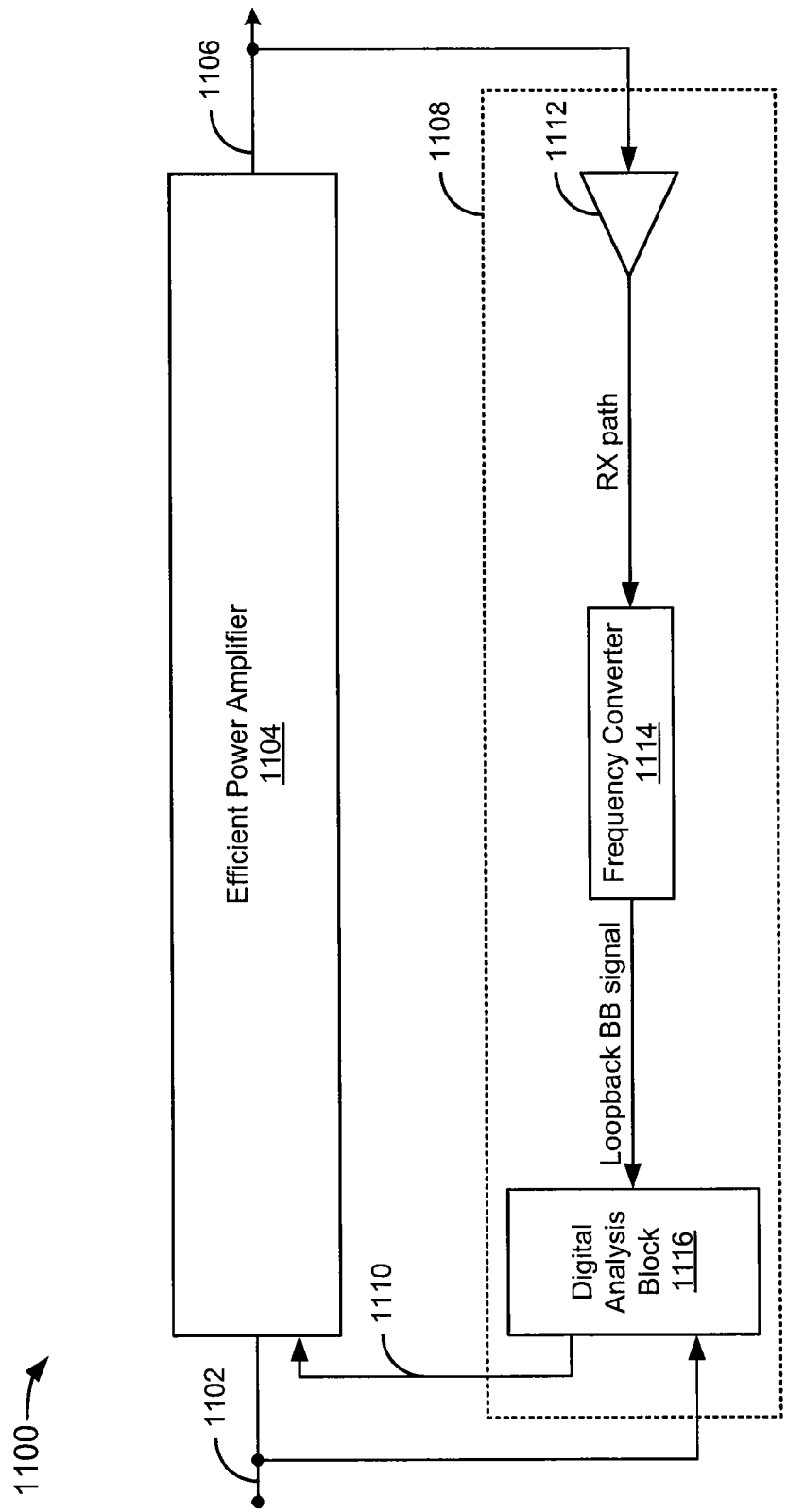
FIG. 11 depicts an example of an efficient power amplifier system with loop-back.

FIG. 11 depicts an example of an efficient power amplifier system 1100 with loop-back. The system 1100 includes Vin 1102, an efficient power amplifier 1104, Vout 1106, a feedback loop 1108, and a feedback signal 1110. In operation, Vin 1102 is coupled to the efficient power amplifier 1104, which amplifies signals as described previously in this paper. Vout 1106 is coupled to the efficient power amplifier 1104 and outputs the amplified signals. In the example of FIG. 11, Vin 1102 and Vout 1106 are inputs to the feedback loop 1108, and a feedback signal 1110 is output from the feedback loop 1108 to the efficient power amplifier 1104. The feedback signal 1110 may be used in a known or convenient manner by a signal processing module (see, e.g., the signal processing module 202, FIG. 2).

In the example of FIG. 11, the feedback loop 1108 includes an amplifier 1112, a frequency converter 1114, and a digital analysis block 1116. In operation, Vout (from the efficient power amplifier) is coupled to the amplifier 1112. A signal from the amplifier 1112 is provided along the receiver (RX) path to the frequency converter 1114, and, after frequency conversion, a loopback BB signal is provided to the digital analysis block 1116. The digital analysis block 1116, analyzes a BB signal (associated with Vin) and the loopback BB signal to provide feedback that is useful to the efficient power amplifier in, in a known or convenient manner, improving efficiency or other characteristics of the efficient power amplifier 1104.

Figure 12:
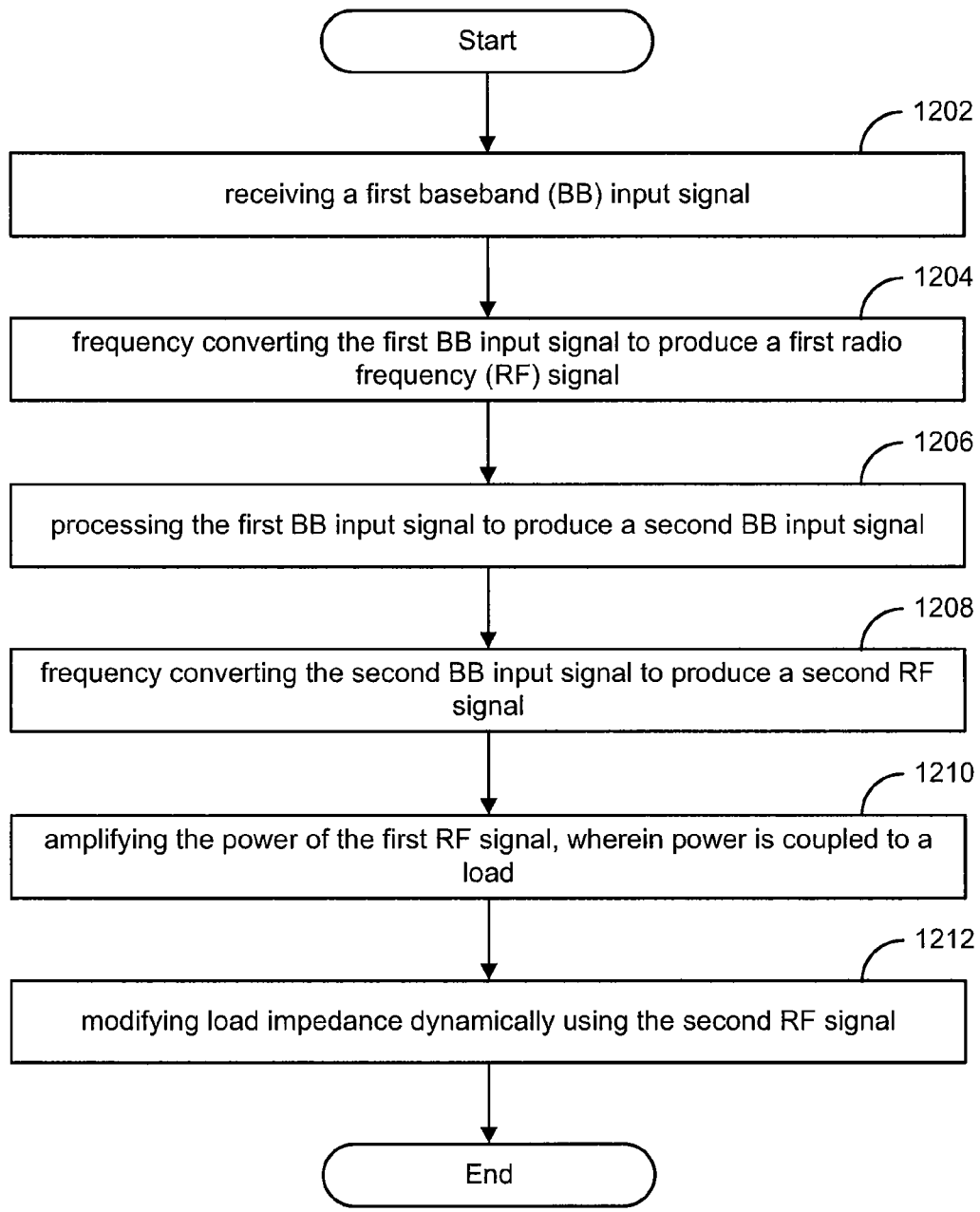
FIG. 12 depicts a flowchart of an example of a method for efficient amplification of a signal.

FIG. 12 depicts a flowchart 1200 of an example of a method for efficient amplification of a signal. Although this figure depicts functional modules in a particular order for purposes of illustration, the process is not limited to any particular order or arrangement. One skilled in the relevant art will appreciate that the various modules portrayed in this figure could be omitted, rearranged, combined and/or adapted in various ways.

In the example of FIG. 12, the flowchart 1200 starts at module 1202 with receiving a first BB input signal. The BB input signal may or may not be processed from an original BB input signal. The first BB input signal may be associated with a main PA path.

In the example of FIG. 12, the flowchart 1200 continues to module 1204 with frequency converting the first BB input signal to produce a first radio frequency (RF) signal. The conversion may or may not include first converting to an IF signal, and then to the RF signal.

In the example of FIG. 12, the flowchart 1200 continues to module 1206 with processing the first BB input signal to produce a second BB input signal. This processing may occur prior to, in parallel with, or after modules 1202 and/or 1204. The second BB input signal may be associated with an auxiliary PA path.

In the example of FIG. 12, the flowchart 1200 continues to module 1208 with frequency converting the second BB input signal to produce a second RF signal. The conversion may or may not include first converting to an IF signal, and then to the RF signal.

In the example of FIG. 12, the flowchart 1200 continues to module 1210 with amplifying the power of the first RF signal, wherein power is coupled to a load.

In the example of FIG. 12, the flowchart 1200 continues to module 1212 with modifying load impedance dynamically using the second RF signal.

Systems described herein may be implemented on any of many possible hardware, firmware, and software systems. Typically, systems such as those described herein are implemented in hardware. Algorithms described herein are implemented in hardware, such as by way of example but not limitation an application-specific integrated circuit (ASIC). RTL code, for example, can be used to generate an ASIC. However, other implementations may be possible. The specific implementation is not critical to an understanding of the techniques described herein and the claimed subject matter.

To further improve the performance, we can add loop back calibration or pre-distortion. These two techniques could be used individually or combined to potentially improve system performance.

Other known or convenient amplifier efficiency enhancement techniques may be used with the amplifiers described herein. For example, envelop tracking of the supply voltage of the amplifiers could be implemented. As another example, for metal oxide semiconductor (MOS) amplifiers, there is a technique to improve efficiency by dynamic biasing the gate of a MOS transistor of the amplifier. Similarly, one could dynamically bias a bipolar junction transistor (BJT) amplifier base. We can use these efficiency improvement techniques for PAs to get better performance.

As used herein, the term "embodiment" means an embodiment that serves to illustrate by way of example but not limitation.

It will be appreciated to those skilled in the art that the preceding examples and embodiments are exemplary and not limiting to the scope of the present invention. It is intended that all permutations, enhancements, equivalents, and improvements thereto that are apparent to those skilled in the art upon a reading of the specification and a study of the drawings are included within the true spirit and scope of the present invention. It is therefore intended that the following appended claims include all such modifications, permutations and equivalents as fall within the true spirit and scope of the present invention.

The invention claimed is:

1. A system power amplifier comprising:
   a first frequency converter coupled at an input to a first baseband (BB) signal to upconvert the first BB signal to Radio Frequency (RF) at an output thereof;
   a power amplifier (PA) coupled at an input to the output of the first frequency converter to amplify the first BB signal at an output thereof;
   an impedance inverter coupled at an input to the output of the PA and configured to couple at an output Vout to a load
   a second frequency converter coupled at an input to a second baseband (BB) signal to upconvert the second BB signal to RF at an output thereof;
   a radio frequency (RF) signal modifier coupled at an input to the output of the second frequency converter and directly coupled at an output to the output Vout of the impedance inverter; and
   a signal processing module having an input coupled to an original baseband signal source and a first and second output coupled to the input of the first frequency converter and the input of the second frequency converter respectively, and the signal processing module splitting the original baseband signal into a main or first BB signal and an auxiliary or second BB signal adjusted at least in a phase shift with respect to one another at the first and second outputs, thereby avoiding a requirement of a tunable phase adjustment in the RF domain when making a Doherty type power amplifier.

2. The system of claim 1, wherein the signal processor module optimizes the first BB signal and the second BB signal in accordance with a transfer function associated with the first frequency converter, the PA, the impedance inverter, the second frequency converter, and the RF signal modifier.

3. The system of claim 1, wherein the RF signal modifier includes one of the group of components consisting of an auxiliary PA, an RF power generator, an RF current generator, some other component capable of modifying RF signals.

* * * * *